(12) United States Patent
McGregor et al.

(10) Patent No.: US 9,502,251 B1
(45) Date of Patent: Nov. 22, 2016

(54) METHOD FOR FABRICATING LOW-COST ISOLATED RESURF LDMOS AND ASSOCIATED BCD MANUFACTURING PROCESS

(71) Applicant: Monolithic Power Systems, Inc., San Jose, CA (US)

(72) Inventors: Joel M. McGregor, Issaquah, WA (US); Jeesung Jung, San Jose, CA (US); Ji-Hyoung Yoo, Los Gatos, CA (US); Eric K. Braun, Mountain View, CA (US)

(73) Assignee: MONOLITHIC POWER SYSTEMS, INC., San Jose, CA (US)

( * ) Notice: Subject to any disclaimer, the term of this patent is extended or adjusted under 35 U.S.C. 154(b) by 0 days.

(21) Appl. No.: 14/869,745

(22) Filed: Sep. 29, 2015

(51) Int. Cl.
*H01L 21/8238* (2006.01)
*H01L 21/225* (2006.01)
*H01L 29/66* (2006.01)
*H01L 29/06* (2006.01)
*H01L 29/08* (2006.01)
*H01L 27/092* (2006.01)

(52) U.S. Cl.
CPC ....... *H01L 21/2253* (2013.01); *H01L 27/0928* (2013.01); *H01L 29/0696* (2013.01); *H01L 29/086* (2013.01); *H01L 29/0878* (2013.01); *H01L 29/66681* (2013.01)

(58) Field of Classification Search
CPC ........... H01L 21/2253; H01L 27/0928; H01L 29/0696; H01L 29/086; H01L 29/0878; H01L 29/66681
USPC ....................................................... 438/200
See application file for complete search history.

(56) References Cited

U.S. PATENT DOCUMENTS

| | | | |
|---|---|---|---|
| 5,286,995 A | | 2/1994 | Malhi et al. |
| 6,025,231 A | | 2/2000 | Hutter et al. |
| 6,729,886 B2 | | 5/2004 | Efland et al. |
| 7,022,560 B2 | | 4/2006 | Olofsson et al. |
| 7,276,431 B2 | | 10/2007 | Williams et al. |
| 7,666,756 B2 | | 2/2010 | Williams et al. |
| 7,800,198 B2 | | 9/2010 | Williams et al. |
| 8,546,879 B2 | | 10/2013 | Disney et al. |
| 8,772,867 B2 | | 7/2014 | Yoo et al. |
| 8,796,100 B2 | | 8/2014 | Jung et al. |
| 8,916,439 B2 | | 12/2014 | Yoo et al. |
| 9,087,774 B2 | | 7/2015 | Jung et al. |
| 2006/0011985 A1* | | 1/2006 | Cai ................... H01L 21/82342 257/369 |
| 2012/0235218 A1* | | 9/2012 | Kutsukake ........ H01L 21/82389 257/314 |
| 2015/0001619 A1 | | 1/2015 | Yoo et al. |
| 2015/0001620 A1 | | 1/2015 | McGregor et al. |

* cited by examiner

*Primary Examiner* — Calvin Choi

(57) ABSTRACT

A method for fabricating a LDMOS device in a semiconductor substrate of a first doping type, including: implanting a series of dopants into the semiconductor substrate using a first mask, and forming a first region of a second doping type adjacent to the surface of the semiconductor substrate, a second region of the first doping type located beneath the first region, and a third region of the second doping type located beneath the second region; implanting dopants into the semiconductor substrate using a second mask, and forming a fourth region of the second doping type adjacent to the first, second and third regions, wherein the fourth region extends from the surface of the semiconductor substrate to approximately the same depth as the third region; and implanting dopants into the first region using a third mask, and form a first well of the first doping type.

20 Claims, 21 Drawing Sheets

METHOD FOR FABRICATING LOW-COST ISOLATED RESURF LDMOS AND ASSOCIATED BCD MANUFACTURING PROCESS

TECHNICAL FIELD

The present invention generally relates to semiconductor devices, and more particularly but not exclusively relates to methods for fabricating Laterally Diffused Metal Oxide Semiconductor (LDMOS) devices and associated BCD manufacturing process.

BACKGROUND

BCD (Bipolar-CMOS-DMOS) process technologies include manufacturing steps to fabricate many different types of semiconductor device in the same silicon substrate. While a logic process may only need to provide NMOS and PMOS transistors, and a memory process may also need to support a small number of devices, BCD processes must provide area-efficient and rugged highside and lowside power transistors (such as LDMOS), logic and analog CMOS, level-shifting MOS transistors, and bipolar transistors. A BCD manufacturing process therefore typically incorporates more masking steps and total processing steps than other manufacturing processes at the same technology node. More process steps mean more expensive wafers. Masking steps are particularly expensive, and silicon foundries typically charge by number of masking steps, making wafer cost directly proportional to number of masking steps.

Two factors determine the cost of a silicon die (not including test and packaging cost, and neglecting the effect of manufacturing yield less than 100%): wafer cost and die size. The die cost is equal to wafer cost divided by die per wafer. Therefore, to minimize die cost, it is important to minimize die area by using small design rules and area-efficient devices, and it is also important to minimize wafer cost by reducing the number of masking steps in the manufacturing process. Many BCD products consist of large power transistors which occupy most of the die area, and other circuitry which occupies a relatively small portion of the total die area. In a case like this, die cost can be minimized by eliminating masking steps that are not necessary for the construction of area-efficient and robust power transistors, and accepting somewhat larger area dedicated to non-power devices. If power transistors take up enough of the die area, the increase in die area is small enough that die cost is also reduced.

Besides masking steps, another processing step that significantly contributes to wafer cost is epitaxial growth ("epi"). Removing epi from a BCD process with lateral power transistors is feasible in a modern manufacturing line with high-energy ion implantation equipment. Without epi, certain analog components (notably vertical NPN and lateral PNP transistors) may have poorer performance and/or larger size than with epi, but this is a good compromise to make if most of the die area is occupied by power transistors.

From the foregoing discussion it can be concluded that an invention which reduces the number of masking steps and eliminates the need for epitaxial deposition, while not adversely affecting power transistor size or robustness, would be useful to a manufacturer of power integrated circuits.

SUMMARY

The embodiments of the present invention are directed to a method for fabricating a LDMOS device in a semiconductor substrate of a first doping type, comprising: implanting a series of dopants into the semiconductor substrate using a first mask, and forming a first region of a second doping type adjacent to the surface of the semiconductor substrate, a second region of the first doping type located beneath the first region, and a third region of the second doping type located beneath the second region; implanting dopants into the semiconductor substrate using a second mask, and forming a fourth region of the second doping type adjacent to the first, second and third regions, wherein the fourth region extends from the surface of the semiconductor substrate to approximately the same depth as the third region; and implanting dopants into the first region using a third mask, and form a first well of the first doping type.

The embodiments of the present invention are also directed to A manufacturing process of a semiconductor integrated circuit, wherein the semiconductor integrated circuit comprises a highside LDMOS, and wherein the manufacturing process comprises: serially implanting n-type, p-type and n-type dopants into the p-type substrate using a first mask, and forming a first region of n-type adjacent to the surface of the p-type substrate, a second region of p-type located beneath the first region, and a third region of n-type located beneath the second region; implanting n-type dopants into the p-type substrate using a second mask, and forming a fourth region of n-type adjacent to the first, second and third regions, wherein the fourth region extends from the surface of the p-type substrate to approximately the same depth as the third region; and implanting p-type dopants into the p-type substrate using a third mask, and forming a first well of p-type in the first region.

The embodiments of the present invention are further directed to A manufacturing process of a semiconductor integrated circuit, wherein the semiconductor integrated circuit comprises a highside LDMOS, a lowside LDMOS, an NMOS and a PMOS, and wherein the manufacturing process comprises: providing a semiconductor substrate; defining a highside drain region, a highside source region enclosing the highside drain region, a highside periphery region surrounding the highside source region, a lowside drain region, a lowside source region adjacent to the lowside drain region, an NMOS region and a PMOS region adjacent to the NMOS region; serially implanting n-type, p-type and n-type dopants into the semiconductor substrate using a first mask, wherein the first mask exposes the high side drain region, highside source region and NMOS region; serially implanting n-type and p-type dopants into the semiconductor substrate using a second mask, wherein the second mask exposes the lowside drain region and lowside source region; implanting n-type dopants into the semiconductor substrate using a third mask, wherein the third mask exposes the highside periphery region and the PMOS region; and implanting p-type dopants into the semiconductor substrate using a fourth mask, wherein the fourth mask exposes the isolation region, the highside source region, the lowside source region and the NMOS region.

BRIEF DESCRIPTION OF THE DRAWING

The present invention can be further understood with reference to the following detailed description and the appended drawings, wherein like elements are provided with like reference numerals. The drawings are only for illustration purpose. They may only show part of the devices and are not necessarily drawn to scale.

FIG. 1b shows low-voltage CMOS transistors that can be manufactured on the same die as the LDMOS of FIG. 1a.

FIG. 1c shows a high-voltage level-shifting NMOS that can be manufactured on the same die as the LDMOS of FIG. 1a.

FIG. 1d shows a high-voltage level-shifting PMOS that can be manufactured on the same die as the LDMOS of FIG. 1a.

FIG. 1e shows a vertical NPN and a lateral PNP that can be manufactured on the same die as the LDMOS of FIG. 1a.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," "right," "in," "out," "front," "back," "up," "down," "top," "atop", "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 1A:
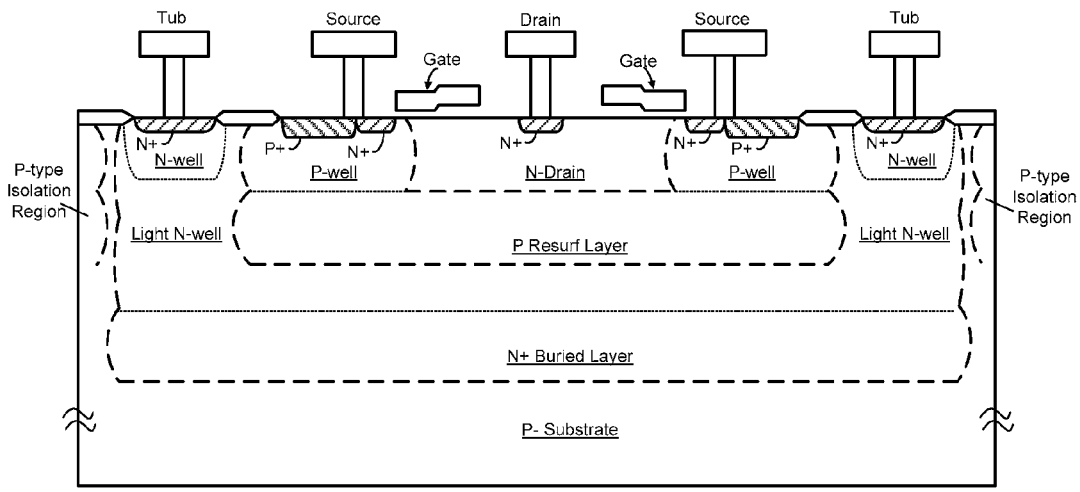
FIG. 1a shows a prior art integrated RESURF LDMOS.
Figure 1B:
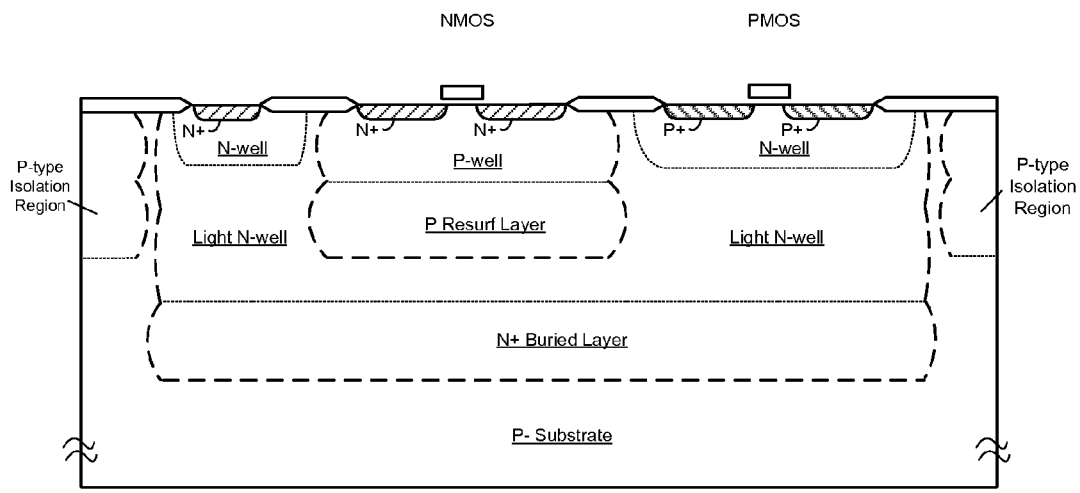
Figure 1C:
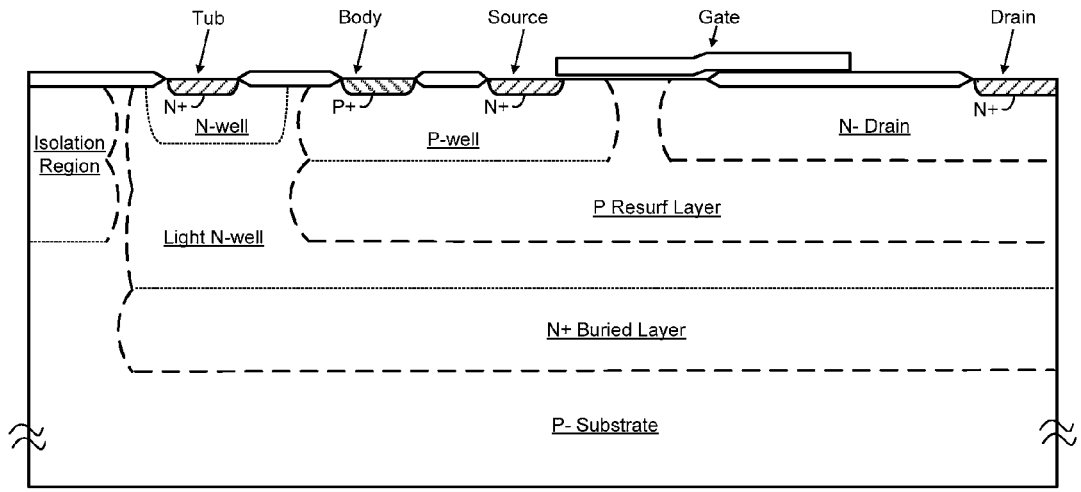
Figure 1D:
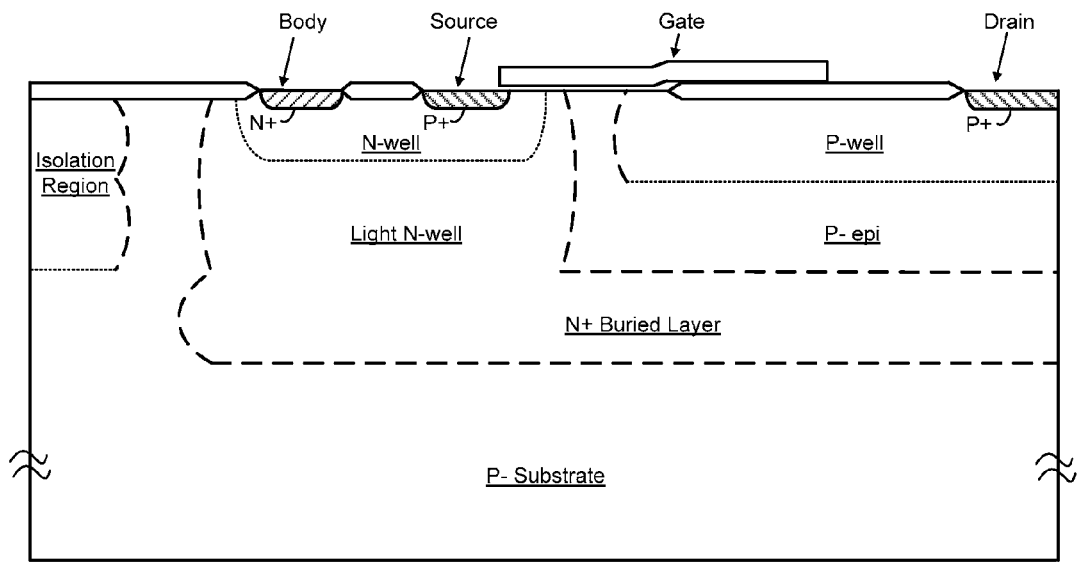
Figure 1E:
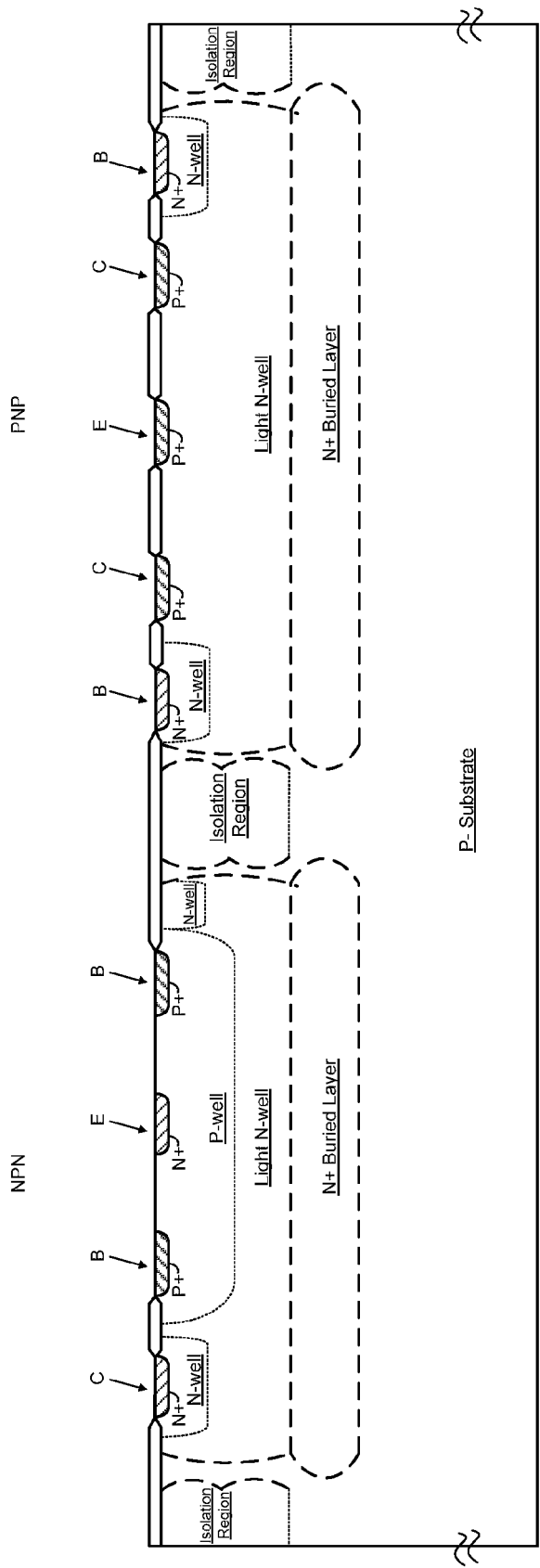

FIGS. 1a-e illustrate prior art devices that may be fabricated using a BCD manufacturing process, wherein FIG. 1a shows an integrated RESURF LDMOS. FIG. 1b shows low-voltage CMOS transistors (including a low-voltage NMOS and a low-voltage PMOS) that can be manufactured on the same die as the LDMOS of FIG. 1a. FIGS. 1c and 1d respectively show a high-voltage level-shifting NMOS and a high-voltage level-shifting PMOS that can be manufactured on the same die as the LDMOS of FIG. 1a. FIG. 1e shows a vertical NPN and a lateral PNP that can be manufactured on the same die as the LDMOS of FIG. 1a.

Table 1 below summarizes the doping type versus depth for eight regions that need to be formed in a BCD integrated circuit.

TABLE 1

| Reg # | Region | Small CD? | 0-1 um | 1-2 um | 2-3 um | >3 um |
|---|---|---|---|---|---|---|
| 1 | Isolation | No | P | p | p | p |
| 2 | Highside drain | No | n | p | n | p |
| 3 | Highside source | Yes | P | p | n | p |
| 4 | Highside periphery | No | N | n | n | p |
| 5 | Lowside drain | No | n | p | p | p |
| 6 | Lowside source | Yes | P | p | p | p |
| 7 | NMOS | No | P | p | n | p |
| 8 | PMOS | No | N | n | X | p |

The "Isolation" region shown in Table 1 means a p-type isolation region, such as shown in FIGS. 1a-b. The "Highside drain" region means the region under the drain of a Highside DMOS, the "Highside source" region means the region under the source of the Highside DMOS. The "Highside periphery" region means the periphery region of the Highside DMOS, such as the region under the "Tub" label in FIG. 1a. The "Lowside drain" and "Low side source" regions are respectively directed to the regions under the drain and source of a Lowside DMOS. There is no lowside periphery region (except maybe P-substrate contact region). The "NMOS" region is corresponding to the region under the label "NMOS" in FIG. 1b, and the "PMOS" region is corresponding to the region under the label "PMOS" in FIG. 1b.

In reference to Table1, "P" represents p-type, or acceptor, doping. P-type dopants include boron, aluminum, and indium. "N" represents n-type, or donor, doping. N-type dopants include phosphorus, arsenic, and antimony. A capital letter denotes a higher doping level than a lower-case letter. "X" represents "don't care", that is, the region at the depth in question can be either n-type or p-type. Two regions, the Highside and Lowside source, are supposed to be small in lateral extent, that is their "CD" or "Critical Dimension" should be small. For modern BCD processes, this probably means their lateral extent is less than about 1 μm (micrometer).

The depth ranges listed in Table 1 are measured from the surface of the silicon and are appropriate for a modern BCD process capable of operating voltages up to around 30V.

They are just approximate and can vary, for example, as much as 50% higher or lower.

The most usual way to fabricate a BCD integrated circuit is to dedicate one mask per implant, or one mask per series of implants of the same conductivity type. For example, a scheme similar to the one in Tables 2 and 3 below could be used.

In Table 2, seven masks are listed, along with the conductivity type and depth of dopants implanted through the mask. The usual semiconductor convention is used where "N+", for example, represents an n-type dopant concentration higher than "N", which in turn is higher than "N−".

TABLE 2

| Mask # | Mask name | Small CD? | 0-1 um | 1-2 um | 2-3 um | >3 um |
|---|---|---|---|---|---|---|
| 1 | N+ Buried layer | No | | | | N+ |
| 2 | Light N-well | No | N− | N− | | |
| 3 | P-resurf | No | | P | | |
| 4 | Lowside drift | No | N− | | | |
| 5 | N-well | No | N | | | |
| 6 | NMOS P-well | No | P | | | |
| 7 | DMOS P-well | Yes | P | | | |

In Table 3, column headings 1 through 8 denote whether that device region, listed in Table 1, is exposed during a given masking step. For instance, regions 2-4 ("Highside drain", "Highside source" and "Highside periphery"), region 7 ("NMOS") and region 8 ("PMOS") are all exposed during the "N+Buried layer" masking step.

TABLE 3

| Mask | | Region Exposed? | | | | | | | |
|---|---|---|---|---|---|---|---|---|---|
| # | Mask name | 1 | 2 | 3 | 4 | 5 | 6 | 7 | 8 |
| 1 | N+ Buried layer | | Y | Y | Y | | | Y | Y |
| 2 | Light N-well | | Y | Y | Y | | | | Y |
| 3 | P-resurf | Y | Y | Y | | Y | Y | Y | |
| 4 | Lowside drift | | | | | Y | Y | | |
| 5 | N-well | | | | Y | | | | Y |
| 6 | NMOS P-well | Y | | | | | | Y | |
| 7 | DMOS P-well | Y | | Y | | | Y | | |

The seven masks listed in Tables 2 and 3 do not include all the masking steps needed to form an Integrated Circuit. Other masks, common in all types of Integrated Circuit process, are further needed. These may include, and are not limited to: active area, MOS gate, DMOS body implant, N+ and P+ source/drain, contact, via and metal interconnect.

Figure 2:
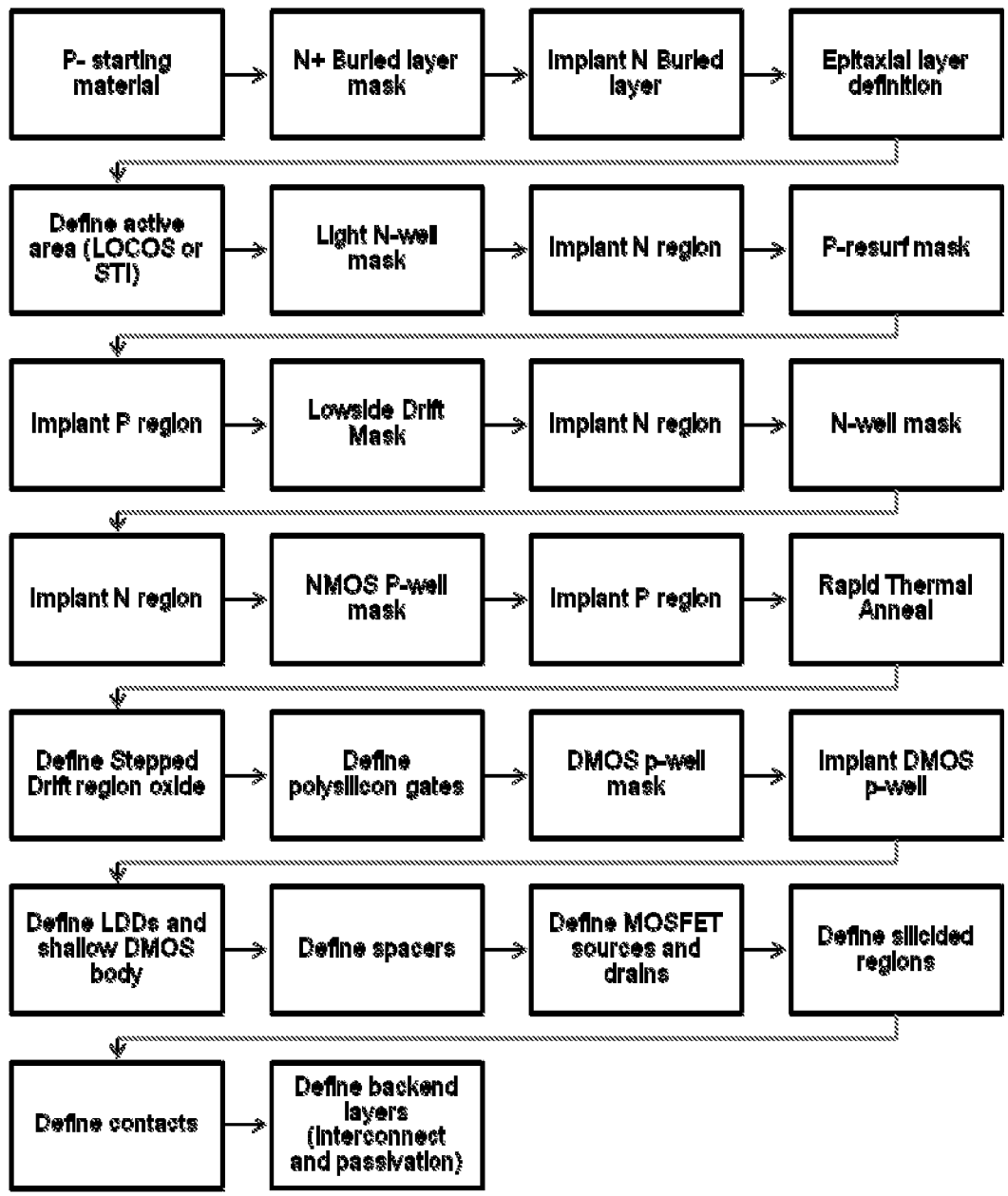
FIG. 2 is a process flowchart outlining a prior art manufacturing process that could be used to fabricate the devices of FIG. 1a-e.

FIG. 2 is a process flowchart outlining a prior art manufacturing process that could be used to fabricate the devices of FIG. 1a-e with the scheme shown in Tables 2 and 3. As can be seen from FIG. 2, seven masks are used and at least 26 steps are needed.

If compromises can be made on the performance or area of non-critical devices, regions 1-8 can be defined with only four masks, and without epitaxial deposition. High-energy ion implanters can implant phosphorus as deep as 3 um into the silicon substrate. The concentration is much less than what is possible using low-energy arsenic or antimony implantation followed by epitaxial deposition. However, a high N+ buried layer concentration is not critical to DMOS or CMOS device performance, so can be dispensed with in the interest of cost.

Referring to Table 1, if the same p-type implant can be used for both DMOS source and NMOS, the "NMOS P-well" and "DMOS p-well" masks can be combined into one fine-pitch (<1 um CD) mask through which a relatively shallow (0-1 um depth) p-type implant is done. Usually DMOS p-well concentration is heavier than NMOS p-well concentration to suppress parasitic NPN turn-on, but if other aspects of the DMOS transistor are designed for high resistance to parasitic NPN turn-on, the same implant can be used for both devices.

Still referring to Table 1, if DMOS and NMOS P-well masks are combined to define a relatively high-concentration p-type region, we can see that regions 2, 3, and 7 can all be exposed at the same time using another mask. Through this mask may be implanted a relatively low-concentration n-type region of 0-1 um depth, a p-type region of 1-2 um depth and an n-type region of 2-3 um depth. Regions 3 ("Highside source") and 7 ("NMOS") have their surface regions (0-1 um) converted to p-type later using the combined p-well mask mentioned above.

Still referring to Table 1, regions 5 ("Lowside drain") and 6 ("Lowside source") can both be exposed at the same time using still another mask. Through this mask may be implanted a relatively low-concentration n-type region of 0-1 um depth and a p-type region of 1-2 um depth. Region 6 has its surface region (0-1 um) converted to p-type later using the combined p-well mask.

Still referring to Table 1, regions 4 (Highside periphery) and 8 (PMOS) can both be exposed at the same time using another mask. Through this mask may be implanted a relatively high-concentration n-type region of 0-1 um depth, and a somewhat lower-concentration n-type region extending to approximately the same depth as the deepest n-type region found in regions 2, 3, and 7.

Therefore, making the changes of the preceding paragraphs, the number of masks can be reduced by three, and an epitaxial deposition is no longer necessary. A simplified process in accordance with an embodiment of the present invention is summarized in Tables 4 and 5 below.

TABLE 4

| Mask # | Mask name | Small CD? | 0-1 um | 1-2 um | 2-3 um | >3 um |
|---|---|---|---|---|---|---|
| 1 | Highside drift | No | N | P | N | |
| 2 | Lowside drift | No | N | P | | |
| 3 | N-well | No | N | N | N | |
| 4 | P-well | Yes | P | | | |

TABLE 5

| Mask | | Region Exposed? | | | | | | | |
|---|---|---|---|---|---|---|---|---|---|
| # | Mask name | 1 | 2 | 3 | 4 | 5 | 6 | 7 | 8 |
| 1 | Highside drift | | Y | Y | | | | Y | |
| 2 | Lowside drift | | | | | Y | Y | | |
| 3 | N-well | | | | Y | | | | Y |
| 4 | P-well | Y | | Y | | | Y | Y | |

FIG. 3a-f illustrate a number of transistor structures that can be formed using the process in accordance with an embodiment of the present invention.

Figure 3A:
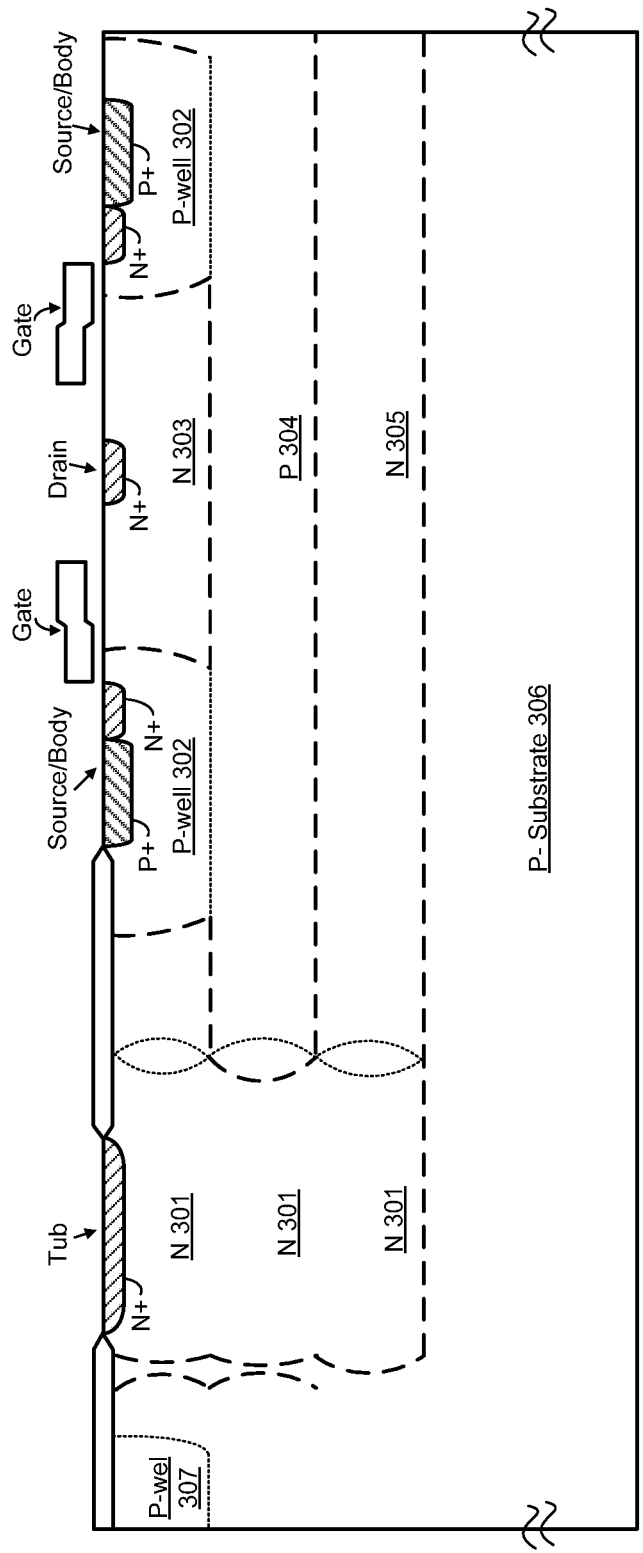
FIG. 3a shows a Highside DMOS transistor that can be manufactured using a method in accordance with an embodiment of the present invention.

FIG. 3a shows a Highside DMOS transistor including the interior region consisting of alternating source and drain stripes, and a peripheral region 301 implanted through the "N-well" mask. The peripheral region 301, along with a deep n-type region 305 implanted through the "Highside drift" mask, isolates the source of the DMOS from a p-type substrate 306. An n-type region 303 is also implanted through the "Highside Drift" mask, along with a p-type Resurf layer 304 beneath it and the aforementioned deep n-type region 305 beneath the p-type Resurf layer 304. In the center of each source stripe and around the periphery of the region which is exposed during the "Highside Drift" masking step to form the regions 303-305, a p-well 302 is implanted through the "P-well" mask, which converts the silicon from n-type to p-type and creates an ohmic contact between the DMOS source/body terminal and the p-type Resurf layer 304 underlying the active device. A p-well 307 is also implanted into the isolation region through the "P-well" mask together with the p-well 302.

Figure 3B:
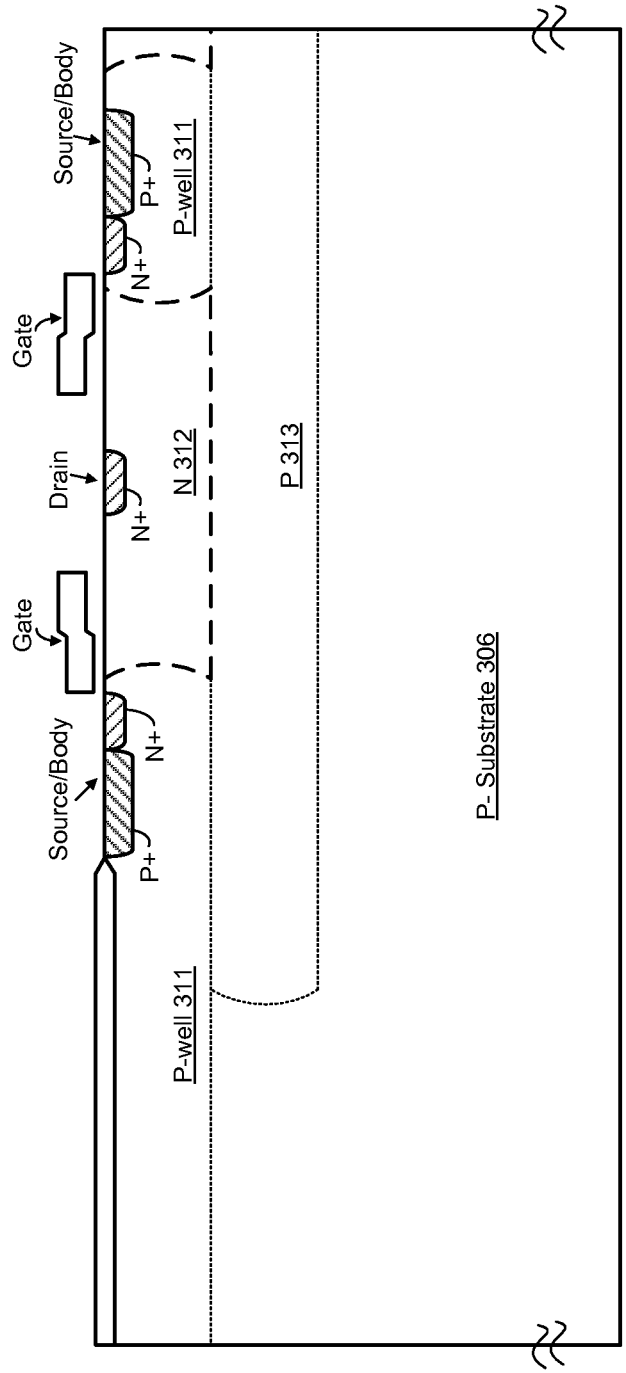
FIG. 3b shows a Lowside DMOS transistor that can be manufactured on the same die as the device of FIG. 3a in accordance with an embodiment of the present invention.

FIG. 3b shows a Lowside DMOS transistor, where the source and body are directly connected through a p-well 311 to the p-type substrate 306. An n-type drain region 312 and a p-type underlying Resurf layer 313 are both implanted through the "Lowside Drift" mask. The p-well 311 is formed by implantation through the "P-well" mask as in the Highside DMOS transistor.

Figure 3C:
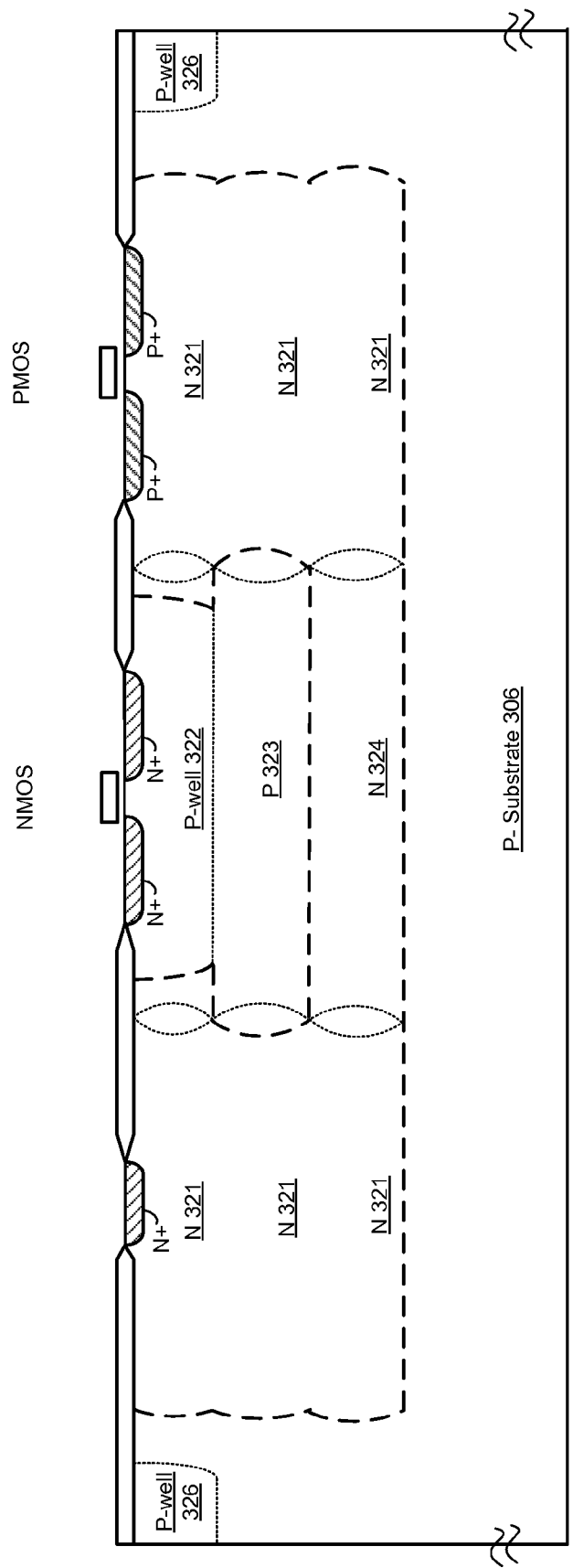
FIG. 3c shows low-voltage CMOS transistors that can be manufactured on the same die as the transistors of FIG. 3a-b in accordance with an embodiment of the present invention.

FIG. 3c shows adjacent NMOS and PMOS transistors, with bodies isolated from the substrate 306. With regard to NMOS, a p-type Resurf layer 323 and a deep n-type region 324 beneath the Resurf layer 323 are both implanted through the "Highside Drift" mask. In the center of the NMOS region, a p-well 322 is implanted through the "P-well" mask, which converts the silicon from n-type to p-type. Referring to PMOS, an n-type body region 321 is implanted through the "N-well" mask. It has a donut shape which surrounds the p-well 322 and the p-type Resurf layer 323 to isolate them from the p-type substrate 306. A p-well 326 is also implanted into the isolation region through the "P-well" mask along with the p-well 322.

Figure 3D:
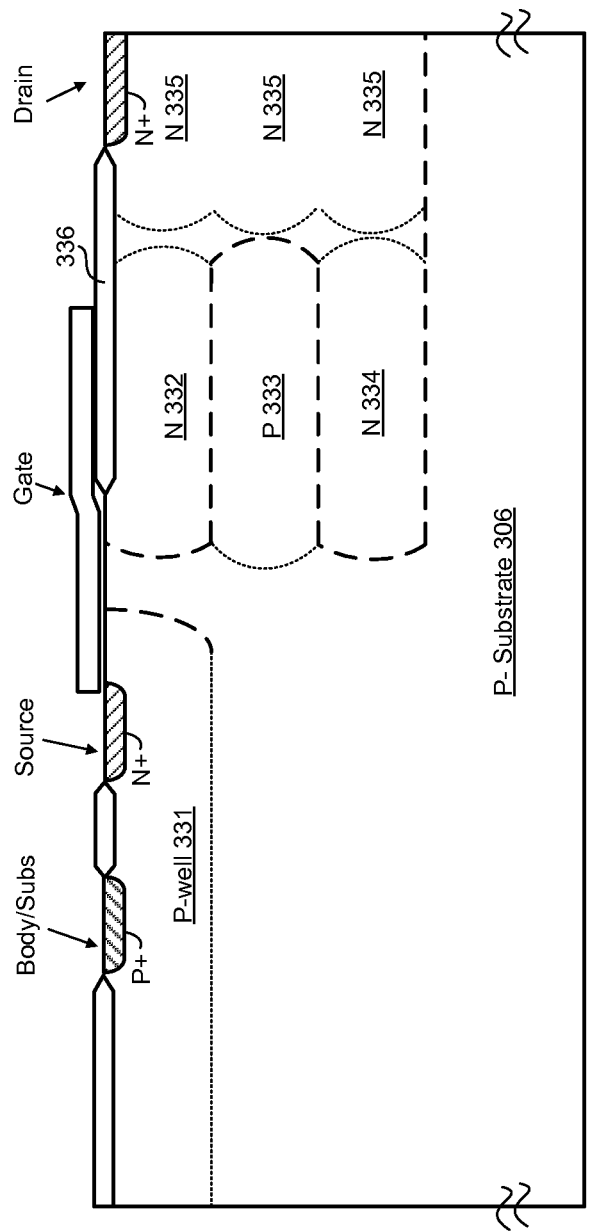
FIG. 3d shows a high-voltage level-shifting NMOS that can be manufactured on the same die as the transistors of FIG. 3a-b in accordance with an embodiment of the present invention.

FIG. 3d shows a high-voltage level-shifting NMOS transistor. The body is connected to the substrate 306 through a p-well 331 which is formed through the "P-well" mask. The source needs not be shorted to body and may be up to a few volts higher in potential than the substrate 306. The drift region across which the drain/source voltage is dropped is located under a thick field oxide 336. The actual drift region is an upper n-type region 332 which is implanted through the "Highside drift" mask along with a p-type Resurf layer 333 and a deep n-type region 334. In the center of the drain stripe is an n-type region 335 implanted through the "N-well" mask. This arrangement allows a somewhat higher drain/source breakdown voltage than the Highside DMOS transistor.

Figure 3E:
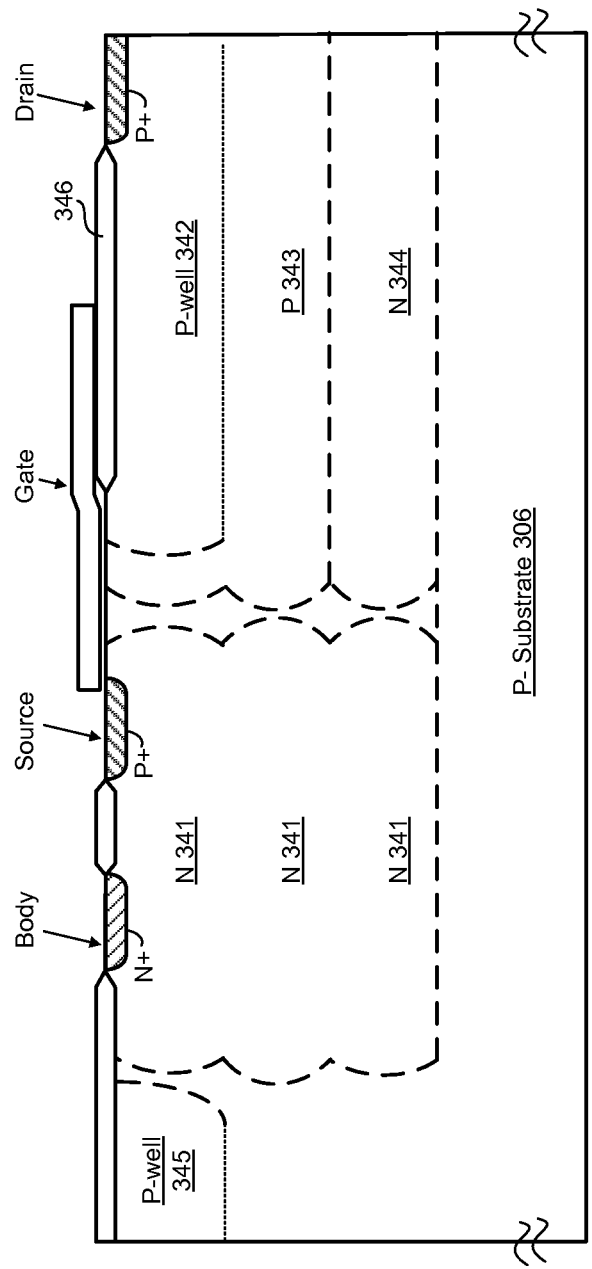
FIG. 3e shows a high-voltage level-shifting PMOS that can be manufactured on the same die as the transistors of FIG. 3a-b in accordance with an embodiment of the present invention.

FIG. 3e shows a high-voltage level-shifting PMOS transistor. The drift region is under a thick field oxide 346 as in the high-voltage level-shifting NMOS. The drain region is formed by a p-well 342 implanted through the "P-well" mask plus a p-type region 343 implanted through the "Highside drift" mask. It is isolated from the substrate 306 by a deep n-type region 344 implanted through the "Highside drift" mask and a surrounding n-well 341 implanted through the "N-well" mask. Moreover, a p-well 345 is implanted into the isolation region through the "P-well" mask along with the p-well 342.

Figure 3F:
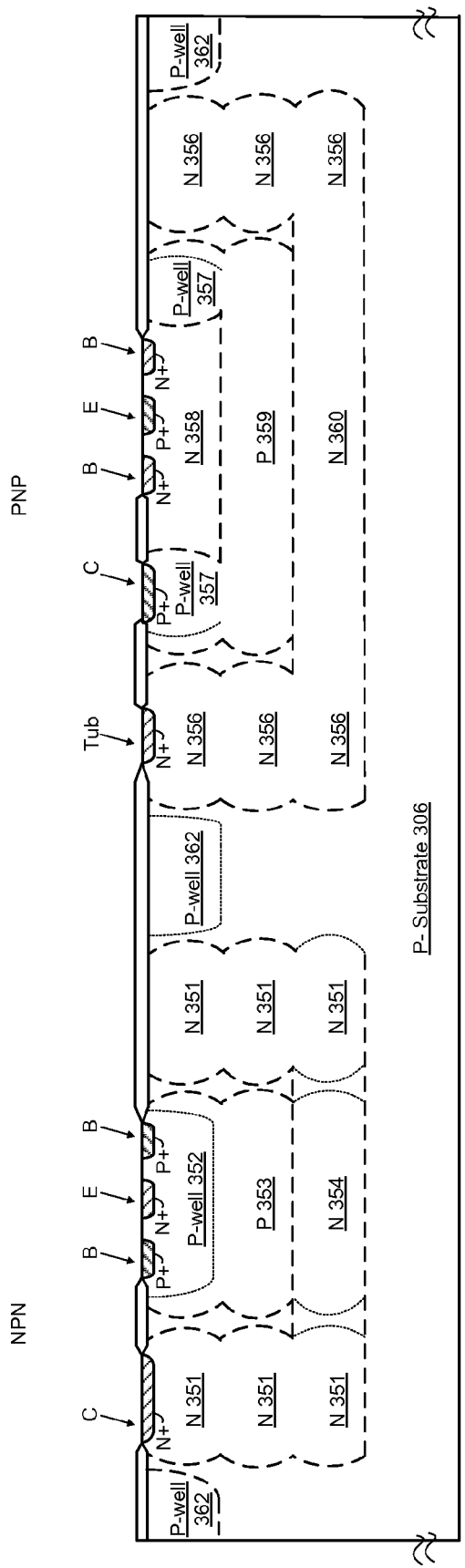
FIG. 3f shows a vertical NPN transistor and an isolated vertical PNP transistor that can be manufactured on the same die as the transistors of FIG. 3a-b in accordance with an embodiment of the present invention.

FIG. 3f shows vertical NPN and vertical PNP transistors. The NPN transistor is similar to prior-art vertical NPN transistors using NBL (N buried layer) in the collector region, except that the collector in this case is a deep n-type region 354 implanted through the "Highside Drift" mask. The base is formed by a p-type region including a p-well 352 implanted through the "P-well" mask and a p-type Resurf layer 353 implanted through the "Highside drift" mask. The base is isolated from the substrate 306 by a deep n-type region 354 implanted through the "Highside drift" mask and a surrounding n-well 351 implanted through the "N-well" mask. The emitter is formed by an N+ region implanted through an NMOS source/drain mask, and the base contacts are formed by p+ regions implanted through a PMOS source/drain mask.

The PNP transistor is also formed using the "Highside drift" mask. The collector is a p-type Resurf layer 359 isolated by a deep n-type region 360. The base is a shallow n-type layer 358 which is implanted through the "Highside Drift" mask along with the p-type Resurf layer 359 and the deep n-type region 360. The emitter is formed by a P+ region implanted through the PMOS source/drain mask and the base contacts are formed by N+ regions implanted through the NMOS source/drain mask. A ring of p-well 357 implanted through the "P-well" mask surrounds the base 358 and provides contact to the collector. The p-type Resurf layer 359 is isolated from the substrate 306 by the deep n-type region 360, and a surrounding n-well region 356 implanted through the "N-well" mask.

Figure 4:
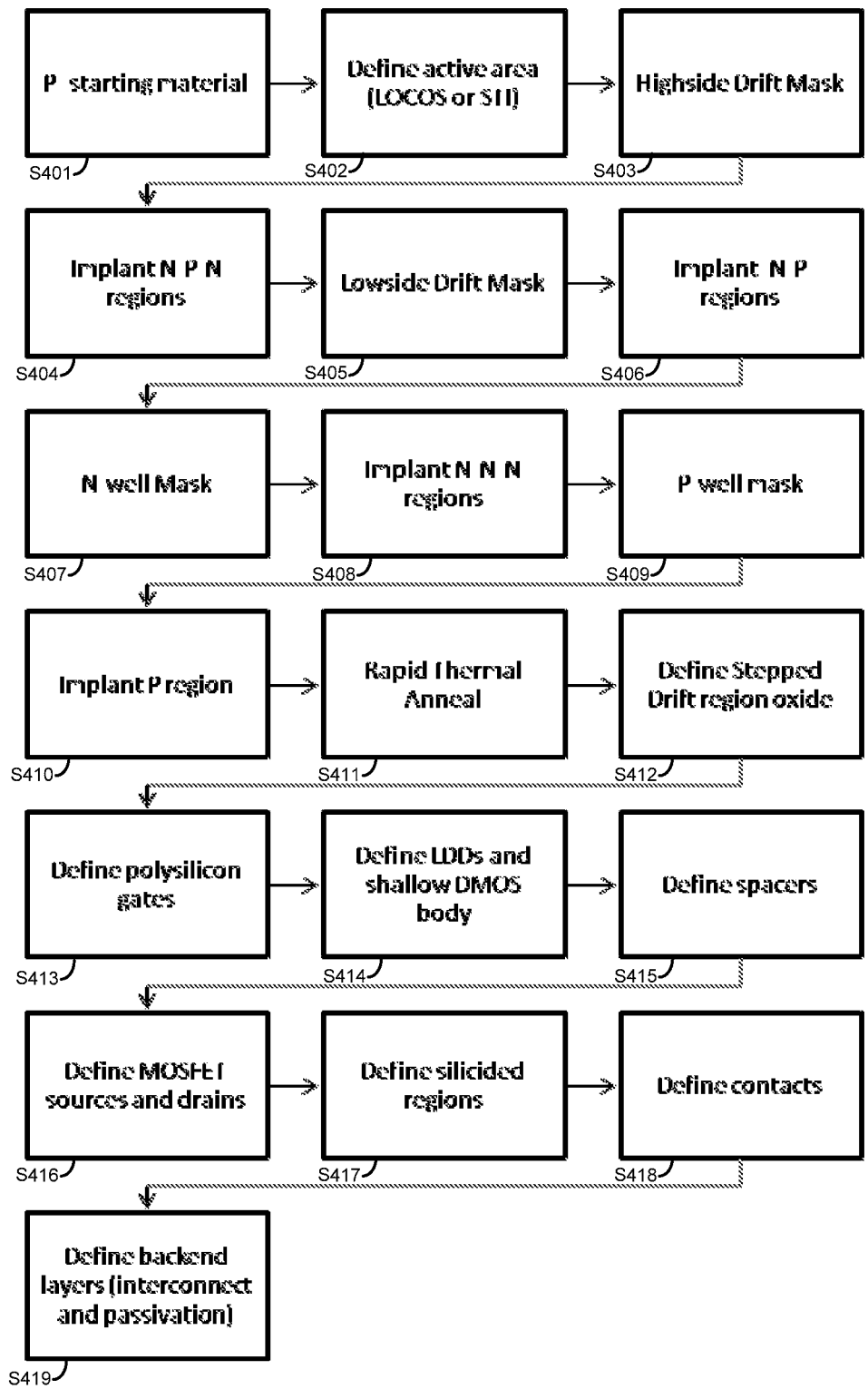
FIG. 4 is a process flowchart outlining a manufacturing process that could be used to fabricate the devices of FIG. 3a-f in accordance with an embodiment of the present invention.

FIG. 4 is a process flowchart outlining a manufacturing process that could be used to fabricate the devices of FIG. 3a-f in accordance with an embodiment of the present invention. It comprises steps S401-419. As provided at step S401, the starting material is a lightly-doped p-type wafer standard in the industry. First, active areas and thick-oxide areas separating them are defined at step S402. This may be done by the so-called "Shallow Trench Isolation" (STI) process, or if low-voltage CMOS packing density may be sacrificed, by the older "Local Oxidation of Silicon" (LOCOS) process. In either case, the oxide between active areas is thick enough to prevent the formation of minority carriers under polysilicon or metal interconnect lines which may cross between active areas. In a typical embodiment, this may be a thickness of 3000 to 8000 angstroms at the end of processing.

After an implant screen oxide is formed, the deep implants which form the MOSFET bodies, the body and drift regions of various transistors, and isolation regions between active devices and substrate, are implanted into the substrate. In one embodiment, long, high-temperature anneal cycles are not used. Doped regions are created by ion implantation, with enough Rapid Thermal Annealing (RTA) to activate the implanted dopant ions, and repair damage to the silicon lattice caused by high-energy implantation. In an embodiment, all four of these "well"-type masks are implanted sequentially, followed by a Rapid Thermal Anneal to activate and anneal all of the implants. Therefore, the order of the four implant masks is not important.

However, in one embodiment, the "Highside Drift" mask shown in the step S403 is the first mask after active area definition and screen oxide growth. Through it, a series of n-type and p-type implants is done at step S404. The order of ion implantations through this mask is not critical. The deepest implant is a donor (e.g. phosphorus) implant of energy 2-3 MeV or higher. For 3 MeV implant energy, the n-type region (e.g. 305, 324, 334, 344, 354, 360) created lies between about 2 um and 3 um depth. It provides electrical isolation between the p-type substrate (e.g. 306) and a p-type Resurf layer (e.g. 304, 323, 333, 343, 353, 359) immediately above it. The next-deepest implant is an acceptor (e.g. boron) implant which creates the p-type Resurf layer (e.g. 304, 323, 333, 343, 353, 359) with depth between approximately 1 um and 2 um. Its exact implant parameters (dose and energy) are determined by the design of the n-channel DMOS power transistor whose drift region lies directly above the Resurf layer. The advantages of a Resurf-type design (placing a p-type layer underneath the n-type drift region of a lateral DMOS to increase breakdown voltage for a given on-resistance) are well-known and will not be addressed in detail here.

Directly above the p-type Resurf layer is implanted an n-type region (e.g. the n-type drift region 303 of the Highside DMOS transistor, 332, 358, etc.). This typically consists of several donor (e.g. phosphorus and/or arsenic) implants to form an n-type region extending from the surface of the silicon to a depth of approximately 1 um.

After the Highside Drift implants have been completed and photoresist cleaned from the wafer, the next masking step S405 in the process uses the "Lowside Drift" mask. Its deepest implant is an acceptor (e.g. boron) Resurf layer (e.g. 313) for the lowside DMOS transistor. Its dose and energy is probably different from the Highside DMOS Resurf implant. Directly above the lowside Resurf layer is the Lowside drift region (e.g. 312), which consists of a series of phosphorus and/or arsenic implants creating an n-type region extending from the surface to a depth of approximately 1 um. The doses and energies of the implants that make up the Lowside drift region are in general different from those that form the Highside drift region.

After the Lowside Drift implants have been completed at step S406 and photoresist cleaned from the wafer, the next masking step S407 in the process uses the "N-well" mask. Through this mask is implanted a series of donor (e.g. phosphorus and/or arsenic) implants at step S408, forming an n-type region (e.g. 301, 321, 335, 341, 351, 356) from the surface down to a depth of approximately 3 um. The "N-well" mask forms the body (e.g. 321) in which low-voltage PMOS transistors are formed. The "N-well" mask is also drawn as a ring (e.g. 301, 321, 351, 356) around Highside DMOS transistors, low-voltage NMOS p-wells, base of vertical NPN transistors and p-type Resurf layers of vertical PNP transistors, so as to isolate them from the substrate (e.g. 306). The purpose of the deeper implants (deeper than about 1 um from the surface) in the n-type region is to provide contact between the top of the silicon and the deep n-type region (e.g. 305, 324, 354, 360) formed through the "Highside Drift" mask. The purpose of the shallower implants is to form an n-well in which low-voltage PMOS transistors are formed, and so on.

After the N-well implants have been completed and photoresist cleaned from the wafer, the next masking step S409 in the process uses the "P-well" mask. Because the p-well implant is limited in lateral extent, in order to form compact Highside and Lowside DMOS transistors, the photoresist used herein is typically thinner than that used for the three preceding masks. This limits the maximum energy of p-well implants. Through this mask is implanted a series of acceptor (e.g. boron) implants at step S410. The implanted p-well region does several jobs: in the source stripe of Highside and lowside DMOS transistors, it (e.g. 302, 311) provides electrical contact between the surface source terminal and the underlying Resurf layer (e.g. 304, 313); it (e.g. 322) provides the body in which low-voltage NMOS transistors are formed; it (e.g. 307, 326, 345, 362) helps isolate N-well regions from each other, etc.

After the removal of the p-well photoresist, the preceding implants are activated, and implant damage is repaired, by a Rapid Thermal Anneal at step S411.

Following these steps, the main part of the Integrated Circuit fabrication according to an embodiment of the present invention is completed. The subsequent processing, to fabricate Lateral DMOS Transistors, low-voltage NMOS and PMOS transistors, and other supporting devices, is probably similar to that described by Yoo et al. in U.S. Pat. No. 8,916,439. For example, a stepped drift region oxide may be formed at step S412, followed by polysilicon gate definition at step S413. After gate definition, a shallow DMOS body region may be formed at step S414, self-aligned to the polysilicon gate. Low-voltage MOS LDDs, if any, are also implanted and annealed, followed by spacer formation at step S415 and shallow N+ and P+ source and drain regions definition at step S416. Self-aligned silicided ("Salicide") regions may be defined at step S417 using another mask followed by contact definition at step S418 and backend interconnect formation at step S419.

Comparing FIG. 4 with FIG. 2, it is apparent that the fabrication method of the present invention reduces the number of masking steps and eliminates the need for epitaxial deposition, which lowers the die cost.

FIG. 5a-e illustrate a process of fabricating a Highside DMOS in accordance with an embodiment of the invention.

Figure 5A:
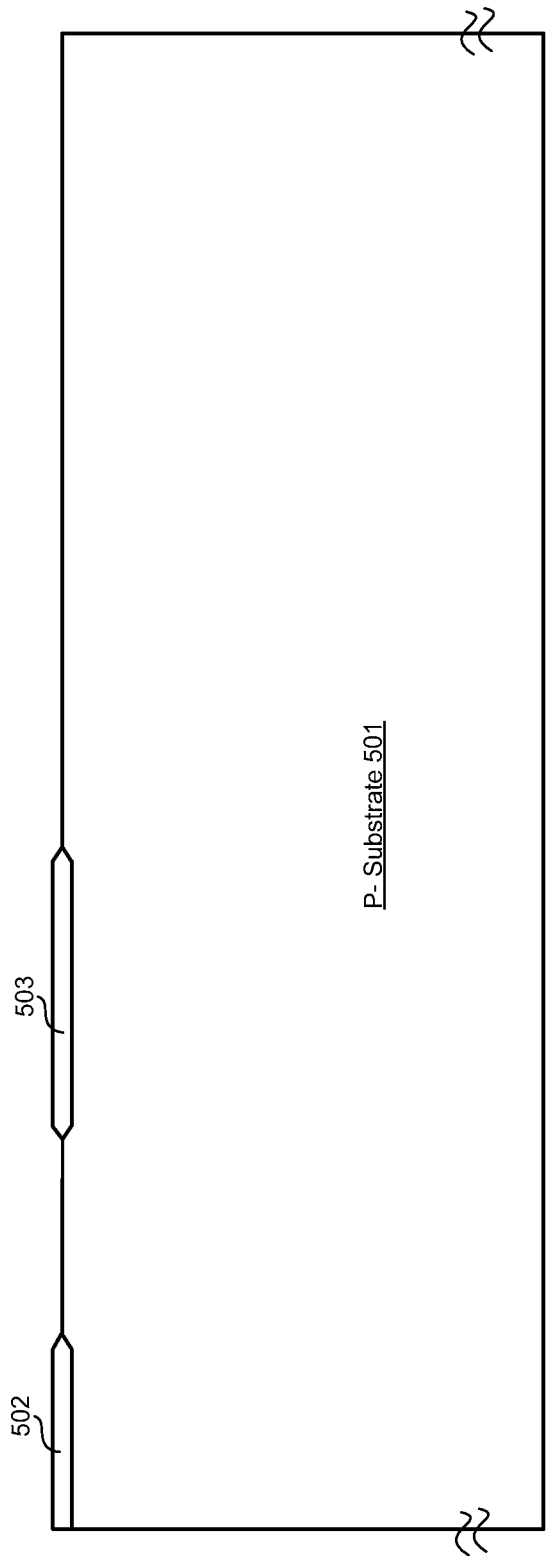
FIGS. 5a-e illustrate a process of fabricating a Highside DMOS in accordance with an embodiment of the present invention.

FIG. 5a shows regions of field oxide (502, 503) between active areas, formed by a LOCOS process on a substrate 501. An STI process could also be used.

Figure 5B:
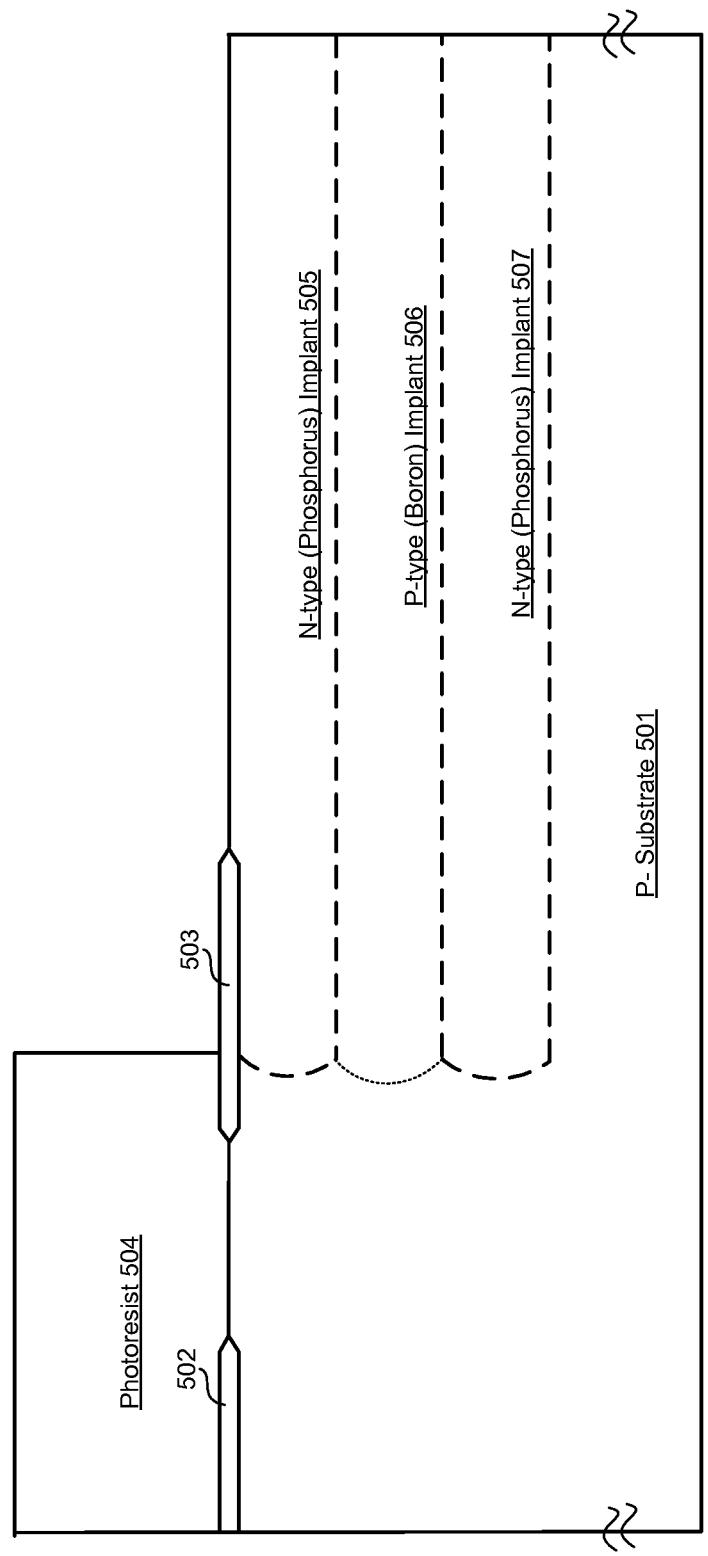

FIG. 5b shows a Highside Drift photoresist 504, and n-type and p-type regions (505-507) formed by Highside Drift ion implantation.

Figure 5C:
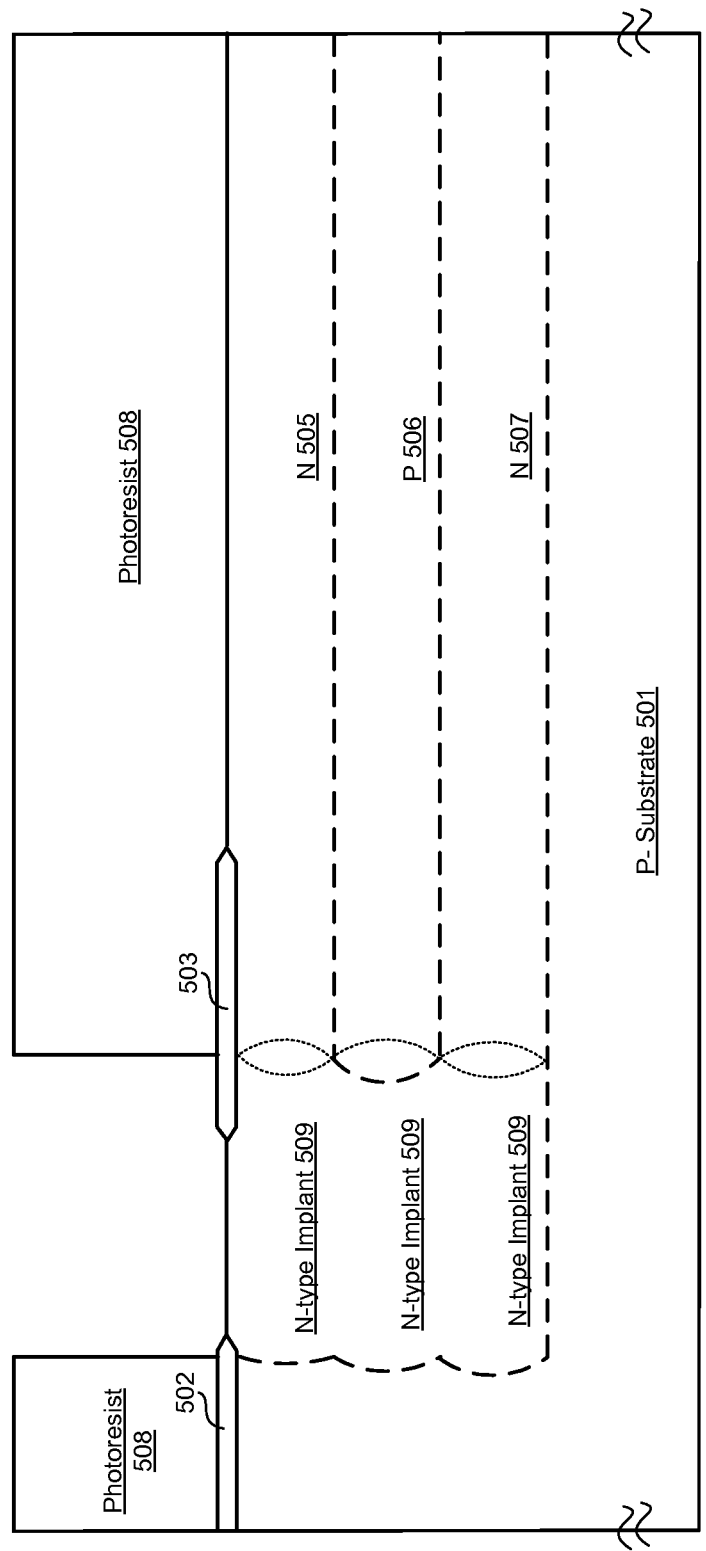

The "Lowside Drift" mask is not used in the formation of the Highside DMOS transistor, so FIG. 5c shows an N-well photoresist 508, and an n-type region 509 formed by N-well ion implantation. In one embodiment, in order to make good electrical contact to the deep N-type region 507, the opening of the "N-well" mask overlaps the opening of the "Highside Drift" mask by a small amount, which means the area exposed during the "N-well" masking step and the area exposed during the "Highside Drift" mask are partially overlapped. In order to isolate the Resurf layer 506 from the substrate 501, the "N-well" mask defines a donut-shaped region completely surrounding the regions 505-507. The overlap mentioned above is critical. Not enough overlap and the Resurf layer 506 will not be electrically isolated from the substrate 501. Too much overlap and the donor doping concentration in the overlap region will be too great, and reduce the breakdown voltage of the Resurf layer 506 to the n-type region 509. This breakdown voltage limits the maximum Drain to Source voltage of the Highside DMOS transistor.

Figure 5D:
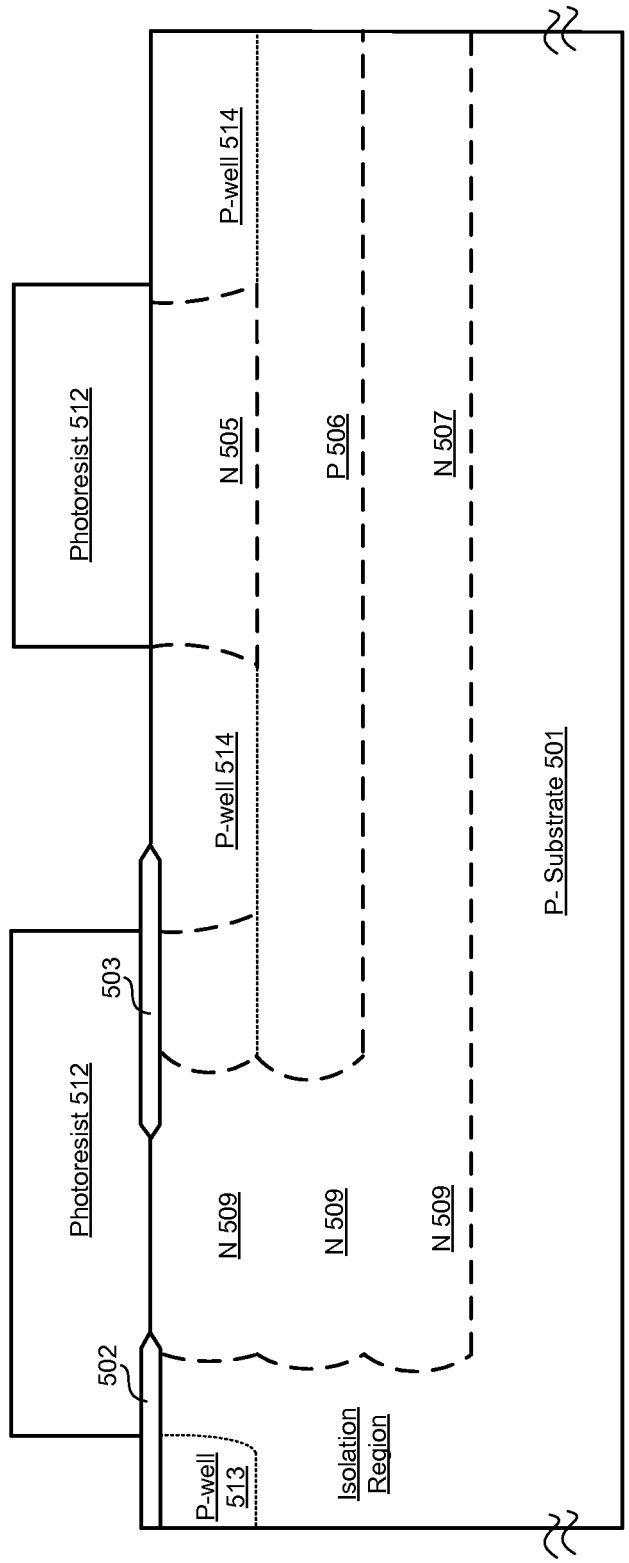

FIG. 5d shows a P-well photoresist 512, and p-type regions (513, 514) formed by P-well ion implantation. A continuous p-well runs along the outer perimeter of the opening of the "Highside Drift" mask, which connects the outer source stripes to the Resurf layer 506. In every interior source stripe, there is also a stripe of p-well (514) connecting the source terminal to the Resurf layer. These P-well stripes are small in lateral extent in order to minimize the pitch, and therefore the area of the DMOS transistor. Outside the N-well ring, a p-well (513) is shown implanted into the isolation region between active devices. This increases punchthrough resistance between active devices and also increases field NMOS threshold voltage to prevent parasitic conduction through induced electron inversion layers under high-voltage interconnect.

Figure 5E:
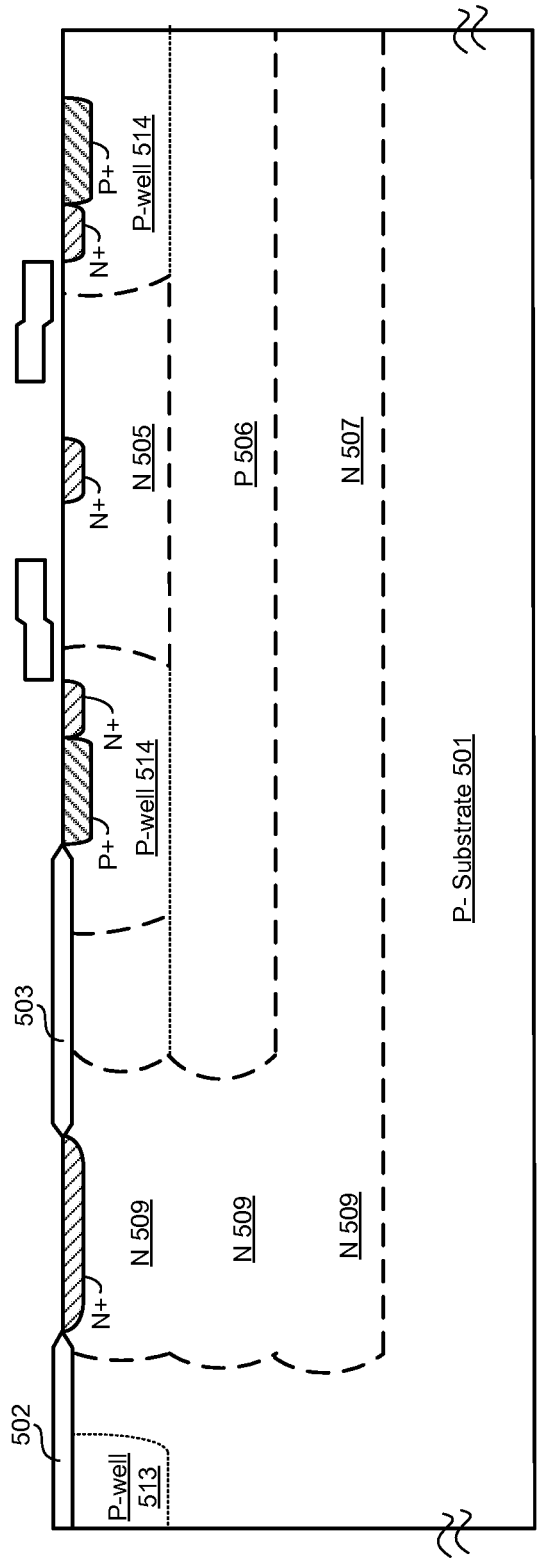

FIG. 5e shows the Highside DMOS transistor after several more process steps. Stepped (thin and thick) gate oxide, polysilicon gate electrodes, the shallow DMOS body, LDDs, and N+ and P+ source/drain regions have been defined by a series of oxidation, deposition, masking, etch, implant, and anneal steps. After this stage, the wafer fabrication is completed by masked silicidation, and contact and interconnect formation.

FIG. 6a-e illustrate a process of fabricating low-voltage CMOS transistors including adjacent NMOS and PMOS transistors in accordance with an embodiment of this invention.

Figure 6A:
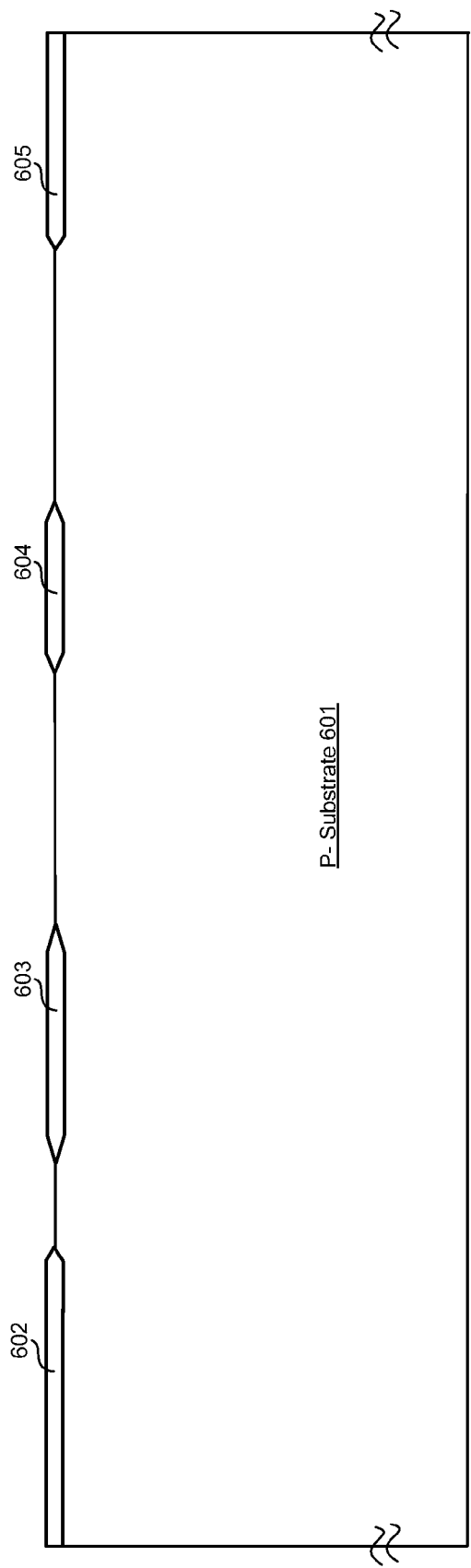
FIGS. 6a-e illustrate a process of fabricating low-voltage CMOS transistors in accordance with an embodiment of the present invention.

FIG. 6a shows regions of field oxide (602-605) between active areas, formed by a LOCOS process on a substrate 601. An STI process could also be used.

Figure 6B:
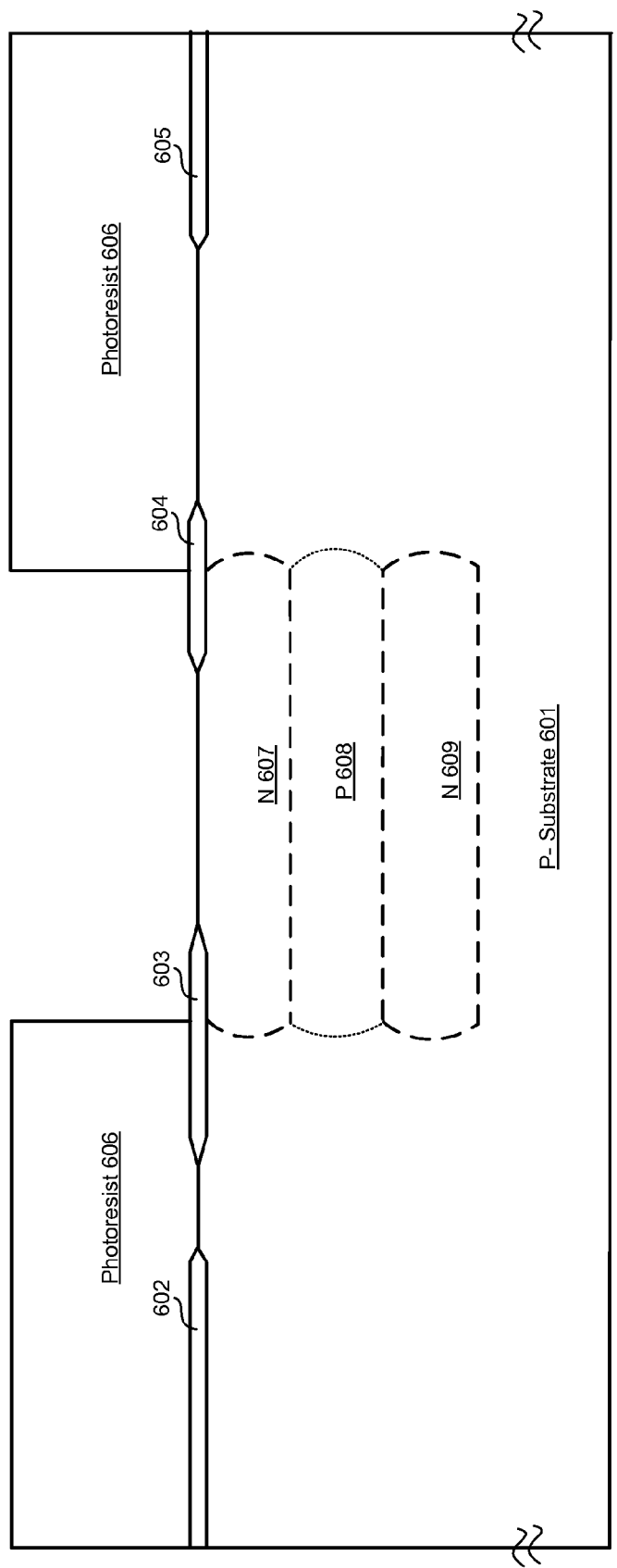

FIG. 6b shows a Highside Drift photoresist 606, and n-type and p-type regions (607-609) formed by Highside Drift ion implantation. The "Highside Drift" mask is opened in areas where NMOS transistors are to be found. The p-type Resurf layer 608 forms the bottom part of the NMOS p-well.

Figure 6C:
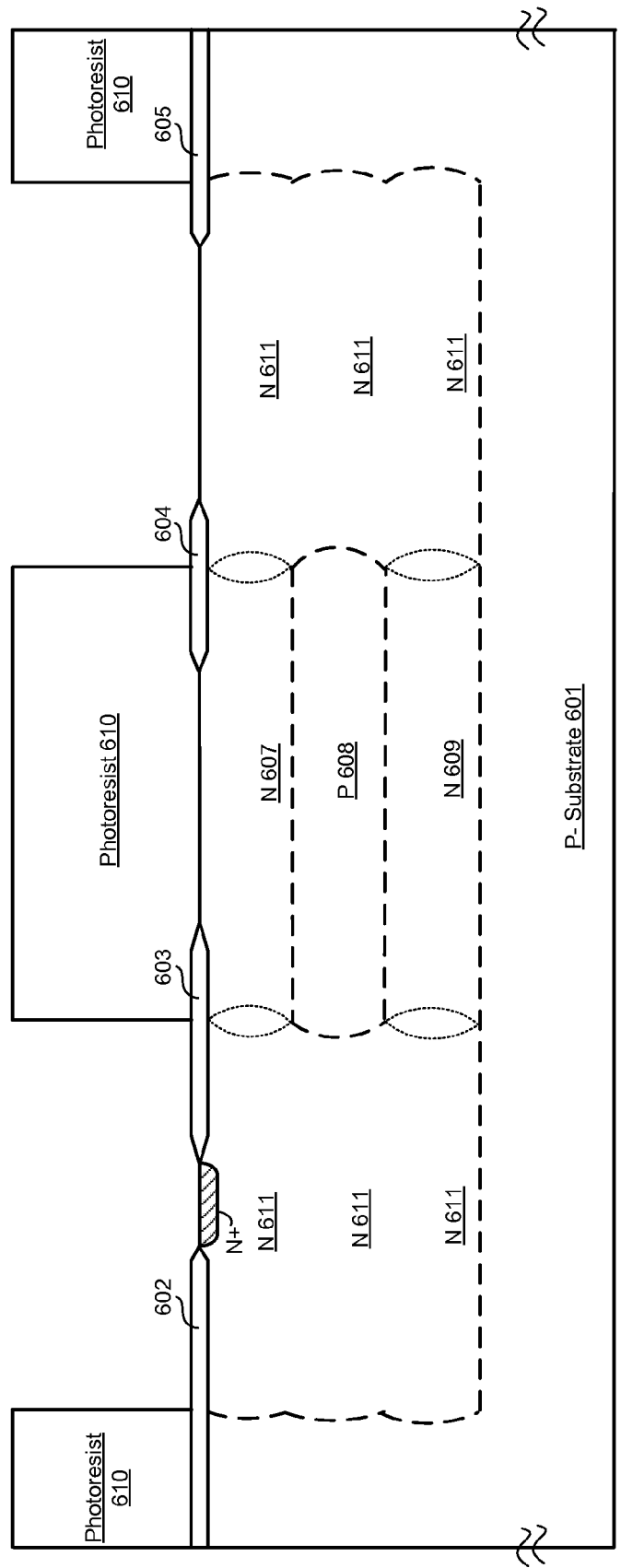

The "Lowside Drift" mask is not used in CMOS device formation, so FIG. 6c shows an N-well photoresist 610, and an n-type region 611 formed by N-well ion implantation. The n-type region 611 provides the body for PMOS transistors, and a donut-shaped N-well region surrounds all isolated NMOS P-well to isolate them from the p-type substrate 601. As in the case of the Highside DMOS, the correct overlap between openings of the "N-well" and "Highside Drift" masks is critical.

Figure 6D:
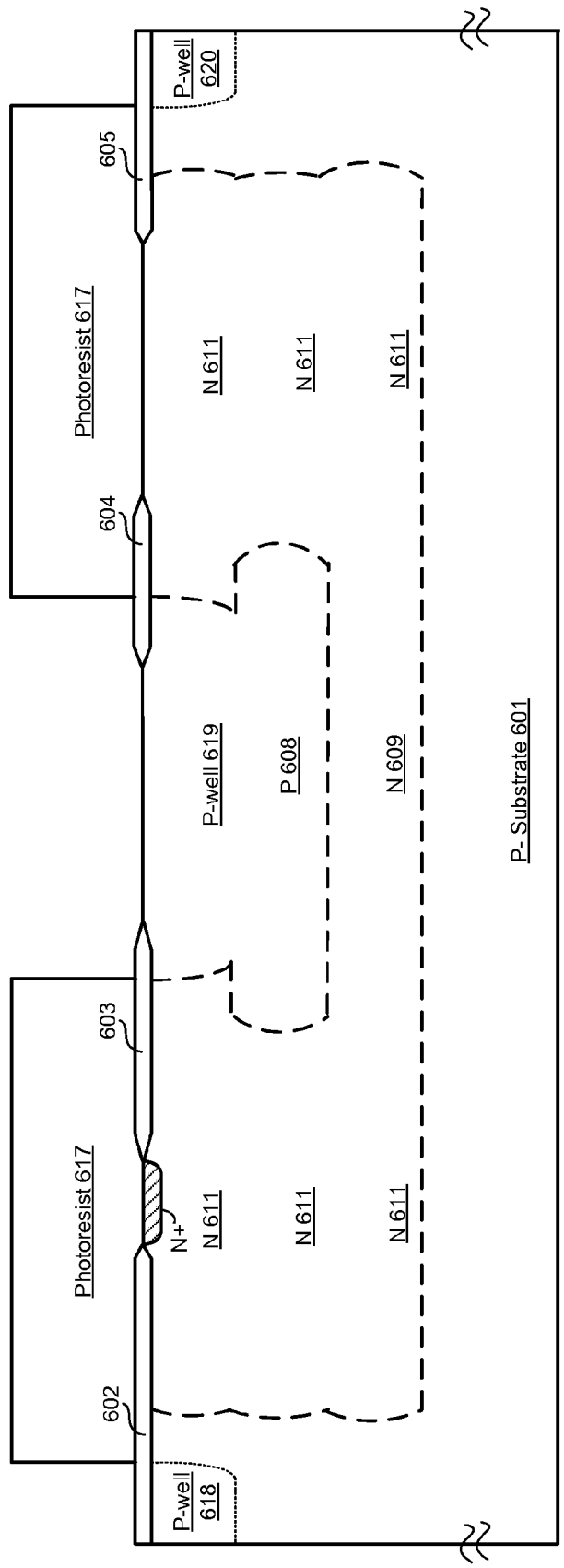

FIG. 6d shows a P-well photoresist 617, and p-type regions (618-620) formed by P-well ion implantation. The p-type ion implants through this mask form the upper part (619) of the NMOS p-well as well as isolation regions (618, 620) between n-wells. The p-type implants are heavy enough to counterdope the shallow donors implanted through the "Highside Drift" mask, converting the top portion of the silicon to p-type. The p-well mask opening may be an undersize of the Highside Drift mask opening, or it may be identical, or it may be an oversize, depending on the electrical requirements of the process.

Figure 6E:
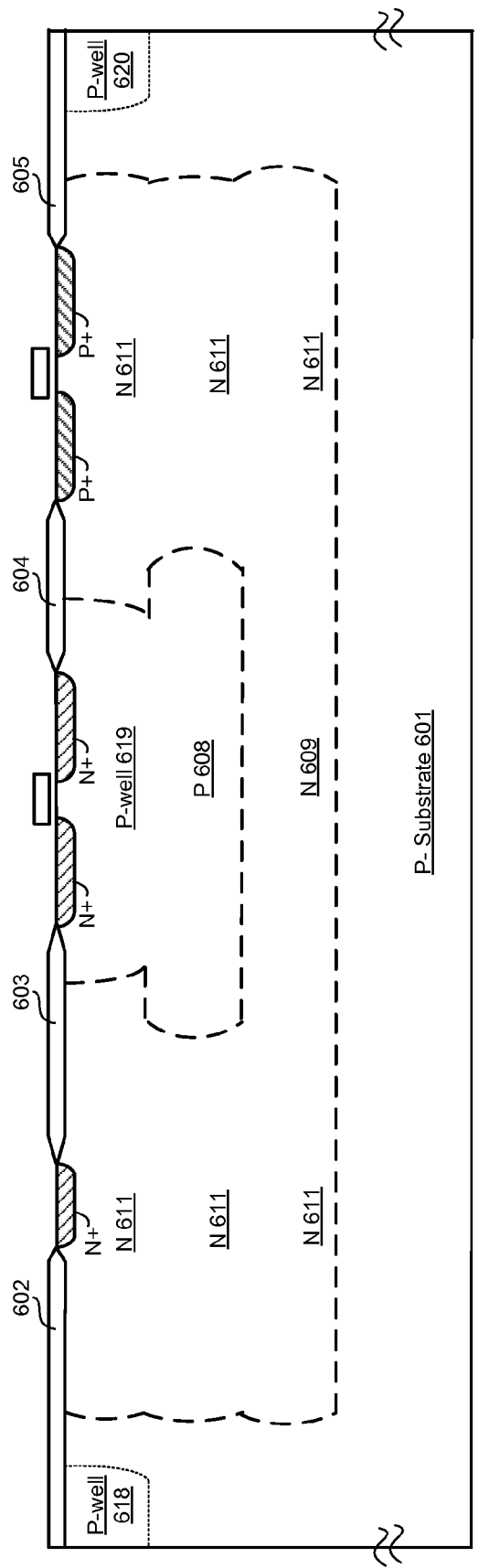

FIG. 6e shows the NMOS and PMOS transistors after several more process steps. Thin gate oxide, CMOS gate, LDDs and threshold adjust implants (if any), and heavily doped source/drain regions have been formed by a series of oxidation, deposition, masking, etch, implant, and anneal steps. After this stage, the wafer fabrication is completed by masked silicidation, followed by contact and interconnect formation.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A method for fabricating a LDMOS device in a semiconductor substrate of a first doping type, comprising:
    implanting a series of dopants into the semiconductor substrate using a first mask, and forming a first region of a second doping type adjacent to the surface of the semiconductor substrate, a second region of the first doping type located beneath the first region, and a third region of the second doping type located beneath the second region;
    implanting dopants into the semiconductor substrate using a second mask, and forming a fourth region of the second doping type adjacent to the first, second and third regions, wherein the fourth region extends from the surface of the semiconductor substrate to approximately the same depth as the third region; and
    implanting dopants into the first region using a third mask, and forming a first well of the first doping type.

2. The method of claim 1, wherein the fourth region partially overlaps the first region, second region and third region.

3. The method of claim 1, wherein the first well is implanted around the periphery of the first region.

4. The method of claim 1, wherein in the fourth region, the doping concentration of the area located within a first depth from the surface of the semiconductor substrate is higher than the doping concentration of the area located beneath the first depth.

5. The method of claim 1, wherein the fourth region has a donut shape surrounding the first region, second region and third region.

6. The method of claim 5, wherein the implantation step using the third mask further comprises forming a second well of the first doping type outside the fourth region.

7. A manufacturing process of a semiconductor integrated circuit, wherein the semiconductor integrated circuit comprises a highside LDMOS, and wherein the manufacturing process comprises:
    providing a p-type substrate;
    serially implanting n-type, p-type and n-type dopants into the p-type substrate using a first mask, and forming a first region of n-type adjacent to the surface of the p-type substrate, a second region of p-type located beneath the first region, and a third region of n-type located beneath the second region;
    implanting n-type dopants into the p-type substrate using a second mask, and forming a fourth region of n-type adjacent to the first, second and third regions, wherein the fourth region extends from the surface of the p-type substrate to approximately the same depth as the third region; and
    implanting p-type dopants into the first region using a third mask, and forming a first well of p-type.

8. The manufacturing process of claim 7, wherein the fourth region partially overlaps the first region, second region and third region.

9. The manufacturing process of claim 7, wherein the first well is implanted around the periphery of the first region.

10. The manufacturing process of claim 7, wherein in the fourth region, the doping concentration of the area located within a first depth from the surface of the p-type substrate is higher than the doping concentration of the area located out of the first depth.

11. The manufacturing process of claim 7, wherein the fourth region has a donut shape surrounding the first region, second region and third region.

12. The manufacturing process of claim 11, wherein the implantation step using the third mask further comprises forming a second well of the first doping type outside the fourth region.

13. The manufacturing process of claim 7, wherein the semiconductor integrated circuit further comprises a lowside LDMOS, and the manufacturing process further comprises:
    implanting n-type and p-type dopants into the p-type substrate using a fourth mask, and forming a fifth region of n-type adjacent to the surface of the p-type substrate and a sixth region of p-type beneath the fifth region; wherein the implantation step using the third mask is further used to form a third well of p-type in the fifth region.

14. The manufacturing process of claim 7, wherein the semiconductor integrated circuit further comprises an NMOS and a PMOS, wherein the implantation step using the first mask is further used to form a seventh region of n-type adjacent to the surface of the p-type substrate, a eighth region of p-type located beneath the seventh region, and a ninth region of n-type located beneath the eighth region;

the implantation step using the second mask is further used to form a tenth region surrounding the seventh region, eighth region and ninth region, wherein the tenth region extends from the surface of the p-type substrate to approximately the same depth as the ninth region; and the implantation step using the third mask is further used to form a fourth well of p-type in the seventh region.

15. The manufacturing process of claim 14, wherein the tenth region partially overlaps the seventh region, eighth region and ninth region.

16. The manufacturing process of claim 7, wherein the semiconductor integrated circuit further comprises a level-shifting NMOS transistor, wherein the implantation step using the first mask is further used to form a eleventh region of n-type adjacent to the surface of the p-type substrate, a twelfth region of p-type located beneath the eleventh region, and a thirteenth region of n-type located beneath the twelfth region;

the implantation step using the second mask is further used to form a fourteenth region at the right side of the eleventh region, twelfth region and thirteenth region, wherein the fourteenth region extends from the surface of the p-type substrate to approximately the same depth as the thirteenth region; and the implantation step using the third mask is further used to form a fifth well of p-type at the left side of the eleventh region.

17. The manufacturing process of claim 7, wherein the semiconductor integrated circuit further comprises a level-shifting PMOS transistor, wherein the implantation step using the first mask is further used to form a fifteenth region of n-type adjacent to the surface of the p-type substrate, a sixteenth region of p-type located beneath the fifteenth region, and a seventeenth region of n-type located beneath the fifteenth region;

the implantation step using the second mask is further used to form a eighteenth region adjacent to the fifteenth region, sixteenth region and seventeenth region, wherein the eighteenth region extends from the surface of the p-type substrate to approximately the same depth as the fifteenth region; and the implantation step using the third mask is further used to form a sixth well of p-type in the fifteenth region.

18. The manufacturing process of claim 7, wherein the semiconductor integrated circuit further comprises a vertical NPN transistor, wherein the implantation step using the first mask is further used to form a nineteenth region of n-type adjacent to the surface of the p-type substrate, a twentieth region of p-type located beneath the nineteenth region, and a twenty first region of n-type located beneath the twentieth region;

the implantation step using the second mask is further used to form a twenty second region surrounding the nineteenth region, twentieth region and twenty first region, wherein the twenty second region extends from the surface of the p-type substrate to approximately the same depth as the twenty first region; and the implantation step using the third mask is further used to form a seventh well of p-type in the nineteenth region.

19. The manufacturing process of claim 7, wherein the semiconductor integrated circuit further comprises a vertical PNP transistor, wherein the implantation step using the first mask is further used to form a twenty third region of n-type adjacent to the surface of the p-type substrate, a twenty fourth region of p-type located beneath the twenty third region, and a twenty fifth region of n-type located beneath the twenty fourth region;

the implantation step using the second mask is further used to form a twenty sixth region surrounding the twenty third region, twenty fourth region and twenty fifth region, wherein the twenty sixth region extends from the surface of the p-type substrate to approximately the same depth as the twenty fifth region; and the implantation step using the third mask is further used to form a eighth well of p-type in the twenty third region.

20. A manufacturing process of a semiconductor integrated circuit, wherein the semiconductor integrated circuit comprises a highside LDMOS, a lowside LDMOS, an NMOS and a PMOS, and wherein the manufacturing process comprises:

providing a semiconductor substrate;

defining a highside drain region, a highside source region enclosing the highside drain region, a highside periphery region surrounding the highside source region, a lowside drain region, a lowside source region adjacent to the lowside drain region, an NMOS region and a PMOS region adjacent to the NMOS region;

serially implanting n-type, p-type and n-type dopants into the semiconductor substrate using a first mask, wherein the first mask exposes the high side drain region, highside source region and NMOS region;

serially implanting n-type and p-type dopants into the semiconductor substrate using a second mask, wherein the second mask exposes the lowside drain region and lowside source region;

implanting n-type dopants into the semiconductor substrate using a third mask, wherein the third mask exposes the highside periphery region and the PMOS region; and implanting p-type dopants into the semiconductor substrate using a fourth mask, wherein the fourth mask exposes the isolation region, the highside source region, the lowside source region and the NMOS region.

* * * * *